United States Patent [19]

Suzuki et al.

[11] Patent Number: 5,311,250
[45] Date of Patent: May 10, 1994

[54] PELLICLE MOUNTING APPARATUS

[75] Inventors: Masaki Suzuki, Hirakata; Kentaro Shingo, Ikeda, both of Japan

[73] Assignee: Matsushita Electric Industrial Co., Ltd., Osaka, Japan

[21] Appl. No.: 950,946

[22] Filed: Sep. 25, 1992

[30] Foreign Application Priority Data

Sep. 27, 1991 [JP] Japan .................. 3-248790

[51] Int. Cl.$^5$ .............................................. G03B 27/62
[52] U.S. Cl. ........................................ 355/76; 156/556
[58] Field of Search ............... 156/381, 382, 580, 581, 156/556; 100/258 R, 258 A; 355/74, 76

[56] References Cited

U.S. PATENT DOCUMENTS

| | | | |
|---|---|---|---|
| 4,443,098 | 4/1984 | Walwyn et al. .................. 355/74 |
| 4,637,713 | 1/1987 | Shulenberger et al. ......... 156/556 X |
| 4,897,966 | 2/1990 | Takahashi ...................... 51/131.5 |

*Primary Examiner*—Michael W. Ball
*Assistant Examiner*—Richard Crispino
*Attorney, Agent, or Firm*—Wenderoth, Lind & Ponack

[57] ABSTRACT

A pellicle mounting apparatus adheres a pellicle frame to a surface of a reticle glass under pressure. The apparatus includes a reticle glass support device for supporting the reticle glass and pellicle frame support device for supporting the pellicle frame. An elastic pressure member is provided on the pellicle frame support device in contact with the pellicle frame along a periphery thereof. The pressure member has a sufficiently small reaction to deformation under the pressure applied to the pellicle frame as compared with the pressure. A pressurizing device applies fluid pressure uniformly to the periphery of the pellicle frame via the elastic pressure member.

18 Claims, 12 Drawing Sheets

Fig. 7A
Fig. 7B
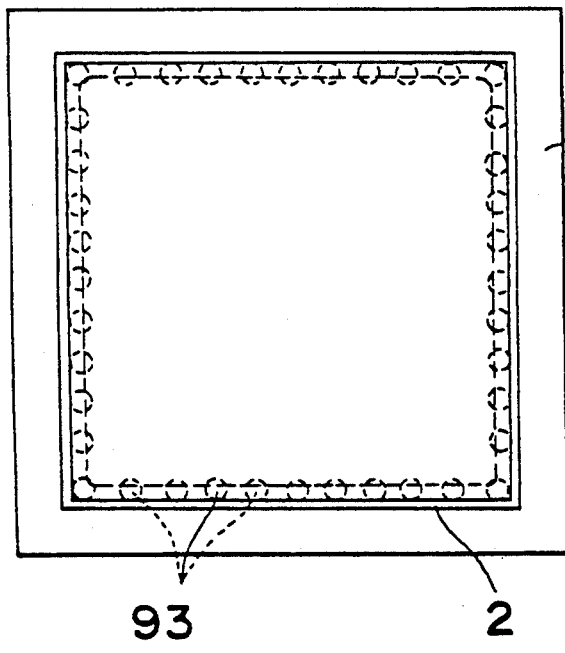
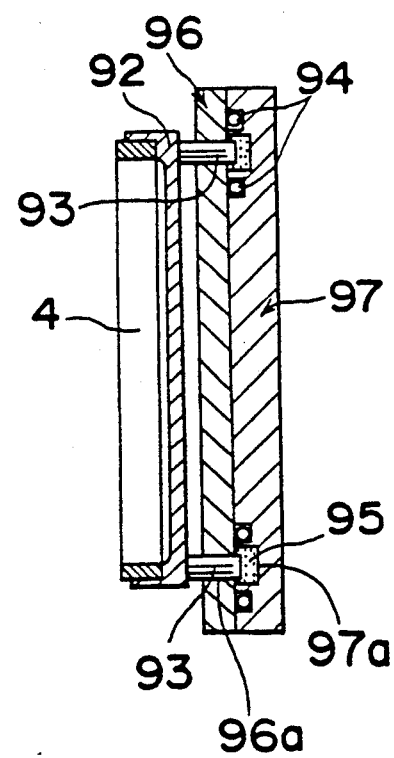

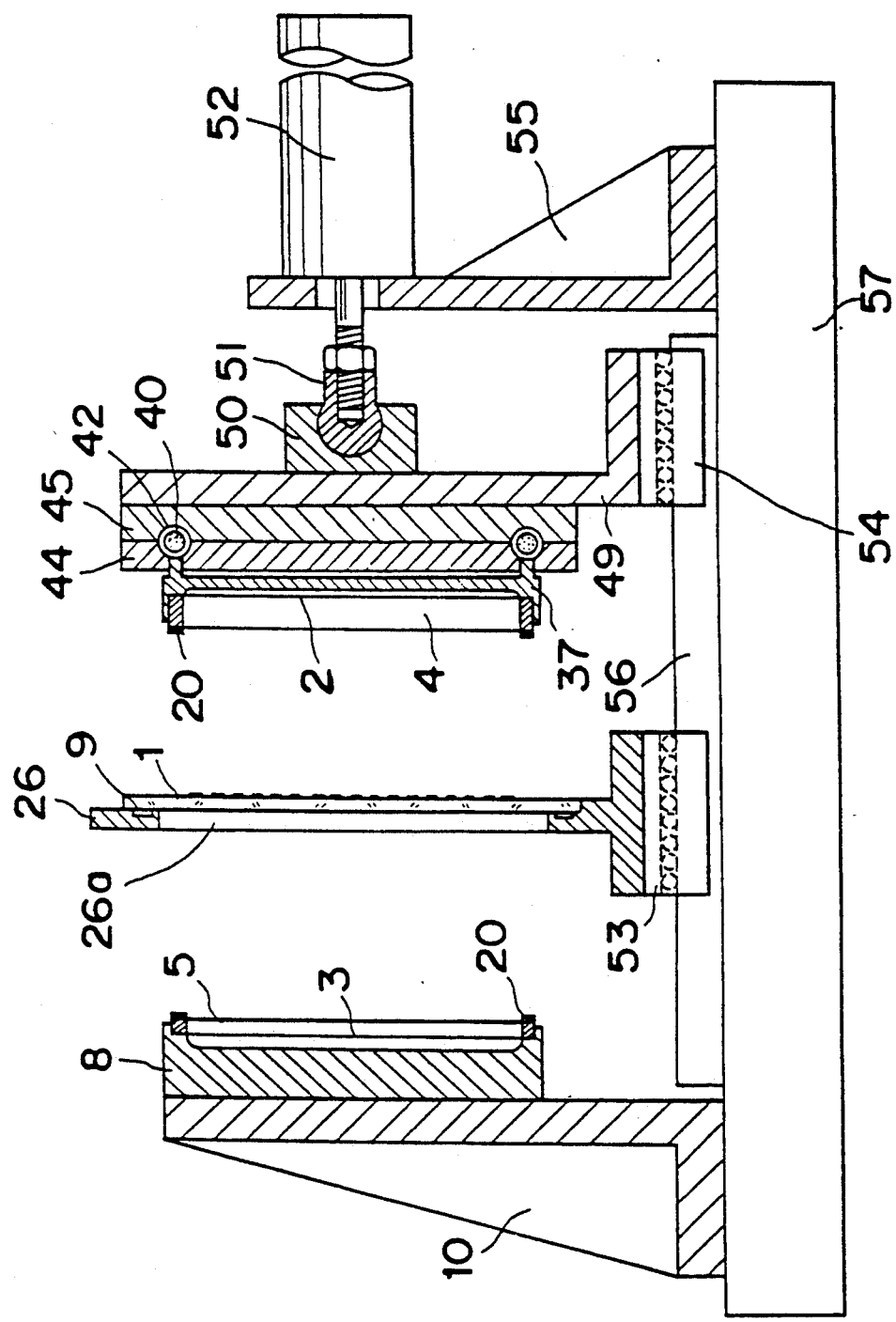

PELLICLE MOUNTING APPARATUS

BACKGROUND OF THE INVENTION

The present invention relates to a pellicle mounting apparatus for adhering one or two pellicle frames, on which a pellicle has been mounted, to one or both surfaces of a reticle glass for use in an exposing apparatus which is used in semi-conductor manufacturing or in liquid crystal display manufacturing by applying pressure to the pellicle frame or frames.

FIGS. 2A and 2B are a sectional view and a front view, respectively showing a product manufactured by a pellicle mounting apparatus. The product comprises a reticle glass 1 having a reticle pattern 22 installed thereon, and pellicle frames 4 and 5 having pellicles 2 and 3 adhered thereto with adhesive layers 20. An example of a conventional pellicle mounting apparatus is described below with reference to FIG. 10, which is a sectional view showing the conventional pellicle mounting apparatus. The pellicles 2 and 3 are adhered to the pellicle frames 4 and 5, respectively. The pellicle frames 4 and 5 are held by pressure members 7 and 8. A suction bracket 6 mounted on a bearing 16 suctions a reticle glass 1 thereto through an opening 9 in a vacuum condition, thus holding it thereon. The pressure member 8 is installed on a fixed bracket 10. A movable bracket 11, on which the pressure member 7 is installed, is mounted on a bearing 17. The bearings 16 and 17 are capable of moving along a guide rail 18. A bearing 12 mounted on the movable bracket 11 is in contact with a spherical joint 13 fixed to a piston rod 21 of a pneumatic cylinder 15 mounted on a bracket 14. The fixed bracket 10, the bracket 14, and the guide rail 18 are fixed to a base frame 19. The adhesive layers 20 are formed on the pellicle frames 4 and 5.

The operation of the pellicle mount apparatus of the above construction is described below. Upon the supply of air to the pneumatic cylinder 15, the piston rod 21 moves leftward, and as a result, the bearing 17 moves leftward along the guide rail 18 via the spherical joint 13, the bearing 12, and the movable bracket 11. As a result, the pellicle frame 4 is brought into contact with the reticle glass 1, thus pressing the bearing 16 leftward along the guide rail 18. Consequently, the reticle glass 1 is brought into contact with the pellicle frame 5. The reticle glass 1 is pressed by the pressure members 7 and 8 in opposite directions, thus being adhered to the pellicle frames 4 and 5 with the adhesive layers 20.

In the above-described construction, it is impossible to absorb an error which has been produced during the manufacture of the parts, for example, the movable bracket 11, the suction bracket 6, or the pressure members 7 and 8, any error of an irregular flatness of the pellicle frames 4 and 5 and the reticle glass 1, and any error of an irregular thickness of the adhesive layer 20. Consequently, it is difficult to perfectly adhere the periphery of the pellicle frames 4 and 5 to the reticle glass 1.

SUMMARY OF THE INVENTION

It is an object of the present invention to provide a pellicle mounting apparatus for adhering a pellicle frame to a reticle glass by applying pressure to the pellicle frame uniformly.

In accomplishing these and other objects, according to one aspect of the present invention, there is provided a pellicle mounting apparatus for adhering a pellicle frame to a surface of a reticle glass under pressure, comprising, a reticle glass support means for supporting the reticle glass, a pellicle frame support means for supporting the pellicle frame, an elastic pressure member provided on the pellicle frame support in contact with the pellicle frame along a periphery thereof, and having a sufficiently small reaction to deformation under pressure applied to the pellicle frame as compared with the pressure, and a pressurizing means for applying fluid pressure uniformly to the periphery of the pellicle frame via the elastic pressure member.

According to the above-described construction, fluid pressure can be uniformly applied to the entire pellicle frame via the elastic pressure member. As a result, the entire pellicle frame can be uniformly pressed against the reticle glass and thus uniformly adhered thereto.

BRIEF DESCRIPTION OF THE DRAWINGS

These and other objects and features of the present invention will become clear from the following description taken in conjunction with the preferred embodiments thereof and with reference to the accompanying drawings, in which:

FIG. 7A and 7B are a partial front view and a partial sectional view showing a pellicle mounting apparatus according to a sixth embodiment of the present invention;

FIG. 8 is a sectional view showing a pellicle mounting apparatus according to another embodiment of the present invention;

DETAILED DESCRIPTION OF THE INVENTION

Figure 1A:
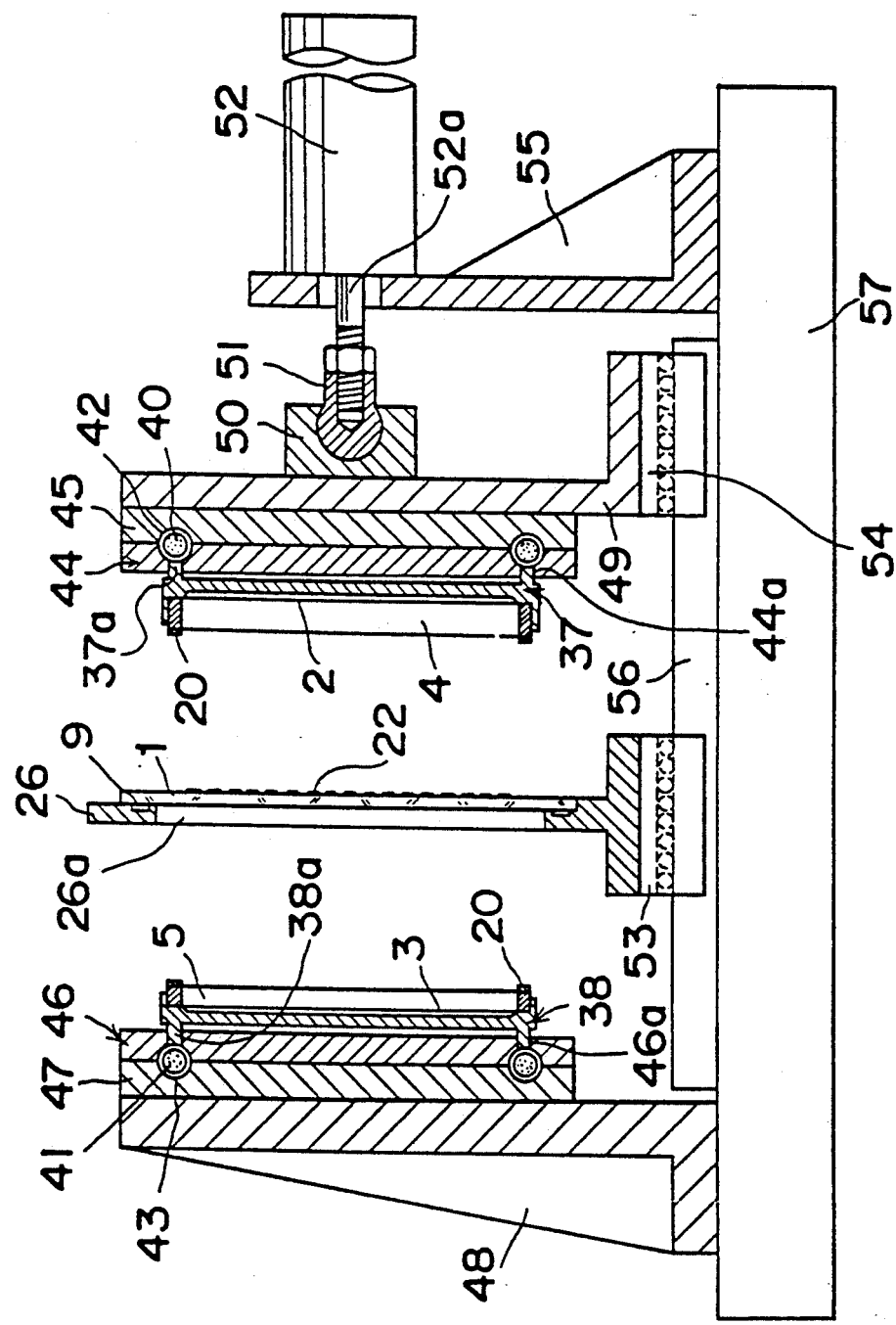
FIG. 1A is a sectional view showing a pellicle mounting apparatus according to a first embodiment of the present invention, in which pellicle frames are be adhered to a reticle glass.

Before the description of the present invention proceeds, it is to be noted that like parts are designated by like reference numerals throughout the accompanying drawings.

Figure 1B:
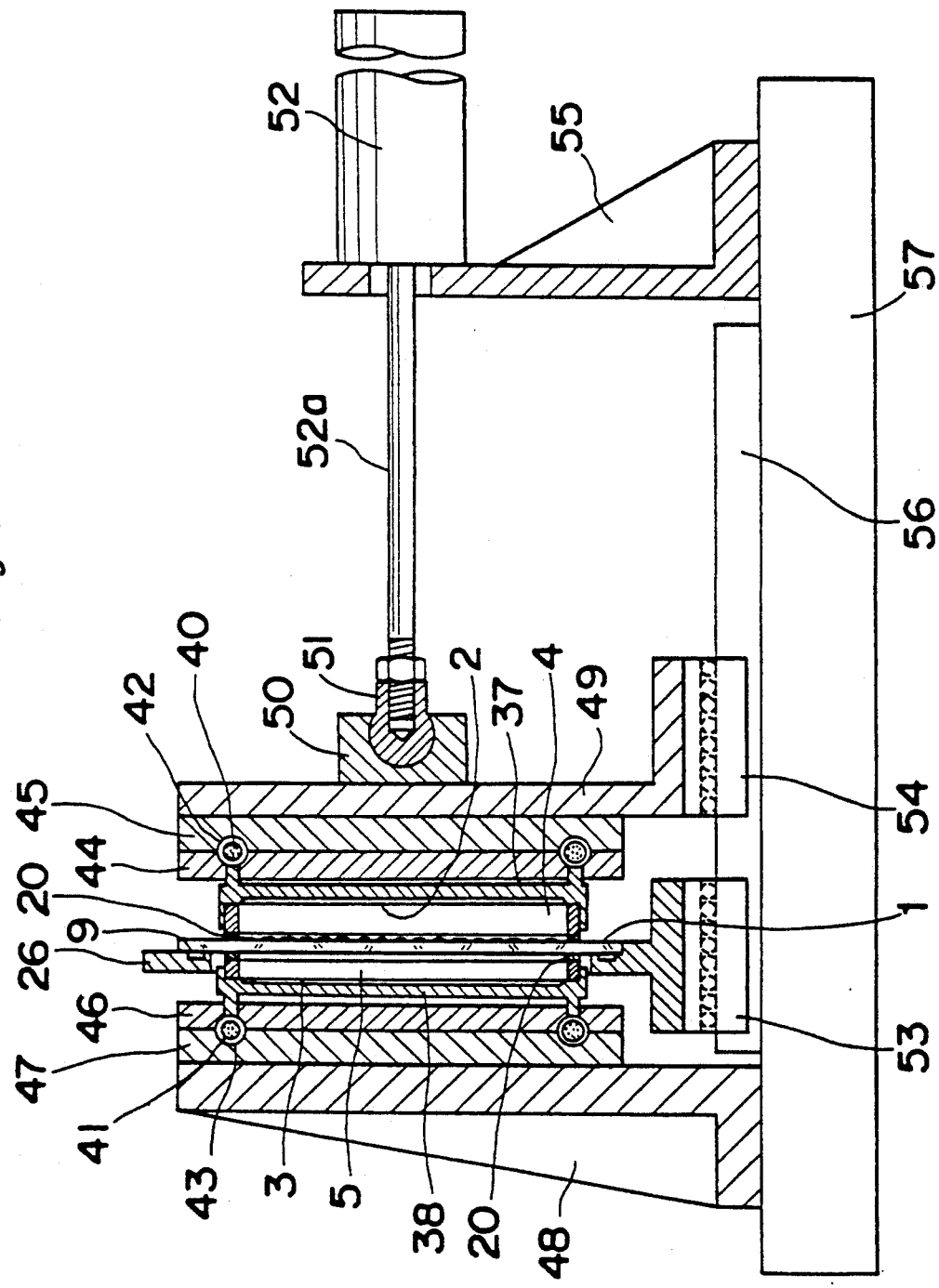
FIG. 1B is a sectional view showing the pellicle mounting apparatus of FIG. 1A where the pellicle frames have been adhered to the reticle glass.
Figure 3A:
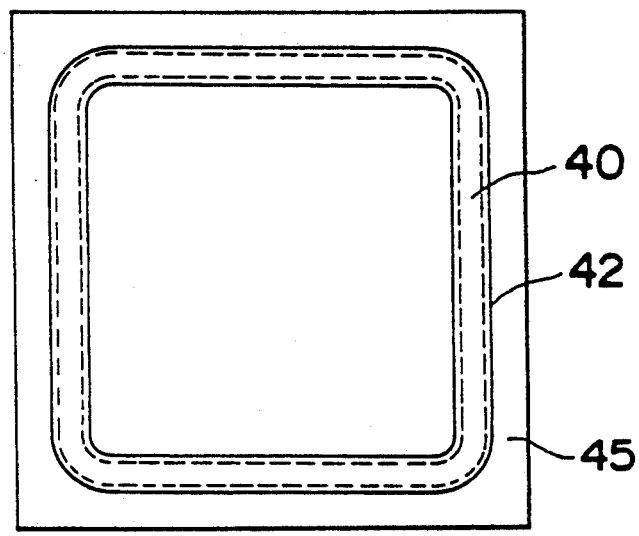
FIG. 3A is a view showing the construction of a holding plate and a tube filled with fluid of the pellicle mounting apparatus according to the first embodiment of the present invention.

An embodiment of the present invention will be described with reference to the drawings. FIGS. 1A and 1B are sectional views showing a pellicle mounting apparatus according to the embodiment. A reticle glass 1 having a reticle pattern 22 on one surface is suctioned to a suction bracket 26 through a vacuum suction opening 9 and held thereby. Pellicles 2 and 3 are adhered to pellicle frames 4 and 5 made of aluminum, respectively. Adhesive layers 20 are adhered onto the surfaces of the pellicle frames 4 and 5. The pellicle frames 4 and 5 are held by elastic pressure members 37 and 38, respectively, made of a material such as aluminum or hard rubber. Each of the pressure members 37 and 38 has a sufficiently small reaction to deformation under the pressure applied to the pellicle frames 4 and 5 as compared with the pressure. The suction bracket 26 has an opening 26a capable of penetrating through the pellicle frame 5 therethrough. Fluids 40 and 41 preferably consisting of, incompressible fluid such as grease or oil are enclosed in tubes 42 and 43, shown in FIG. 3A, which tubes are very elastic. The tubes 42 and 43 are held by grooves formed between holding plates 44 and 45 and between holding plates 46 and 47 in correspondence with the periphery of the pellicle frames 4 and 5, as shown in FIG. 3A. The pressure members 37 and 38 are slidably held by the holding plates 44 and 46 and in contact with the tubes 42 and 43, respectively. That is, the pressure members 37 and 38 have rectangular frame-shaped projections 37a and 38a slidably inserted into holes 44a and 46a to contact the tubes 42 and 3, respectively. The holding plates 47 and 45 are fixed to brackets 48 and 49, respectively. The pressure members 37 and 38 are supported with bolts (not shown) onto the holding plates 44 and 46 so as to allow the above movement of the pressure members 37 and 38. The holding plates 44 and 46 are fixed to the holding members 45 and 47. The suction bracket 26 and the bracket 49 are each mounted on bearings 53 and 54 capable of moving along a guide rail 56. A bearing 50 mounted on the bracket 49 is in contact with a spherical joint 51 fixed to a piston rod 52a of a pneumatic cylinder 52 installed on a bracket 55. The brackets 48 and 55 and the guide rail 56 are fixed to a base frame 57.

Figure 2A:
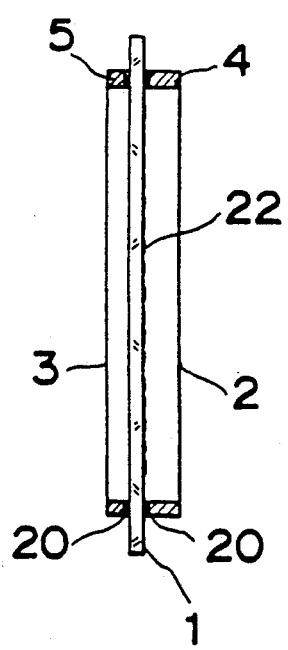
FIGS. 2A and 2B are a sectional view and a front view, respectively, showing a product in which pellicle frames have been adhered to a reticle glass by the pellicle mounting apparatus of FIG. 1A.
Figure 2B:
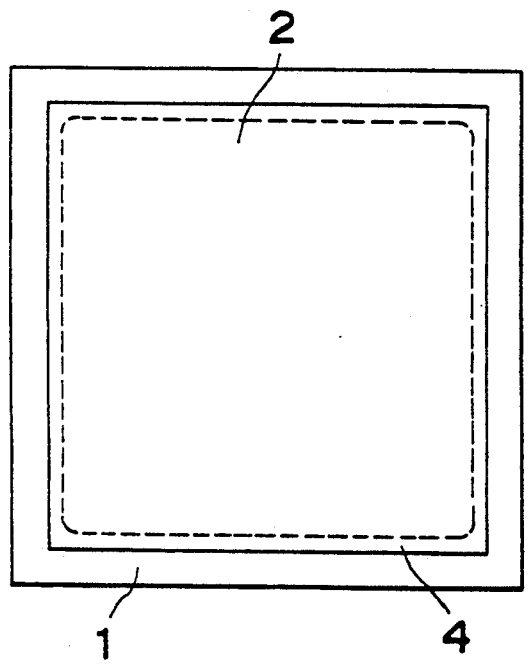
Figure 2C:
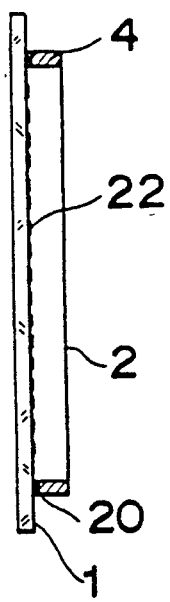
FIG. 2C is a sectional view showing a product in which a pellicle frame has been adhered to a reticle glass.

The operation of the pellicle mount apparatus of the above construction is described below. Upon the supply of air to the pneumatic cylinder 52, the piston rod 52a moves leftward, and consequently the bracket 49 moves leftward along the guide rail 56 through the bearing 54 by applying a leftward force to the bracket 49 from the piston rod 52a via the spherical joint 51 and the bearing 50. As a result, the pellicle frame 4 is brought into contact with the reticle glass 1, thus pressing the suction bracket 26 leftward. Consequently, the bracket 26 moves leftward along the guide rail 56 through the bearing 53, thus bringing the reticle glass 1 into contact with the pellicle frame 5 as shown in FIG. 1B. The pellicle frames 4 and 5 are pressed against the reticle glass 1 with the pressure of the fluids 40 and 41, each enclosed in the tubes 42 and 43, uniformly applied to the pellicle frames 4 and 5 along the periphery thereof through the elastic members 37 and 38, respectively, as shown in FIG. 1B. Thus, the pellicle frames 4 and 5 are uniformly adhered to the reticle glass 1 with the adhesive layers 20. FIGS. 2A and 2B show a product manufactured by the pellicle mount apparatus. In one example, the force applied from the pneumatic cylinder 52 to the bracket 49 is 30 kgf, the thickness of the reticle glass 1 is 3–5 mm, and each of the square pellicle frames 4 and 5 has sides of 100 mm, a height of 4 or 5 mm, and a width of 2 mm. FIG. 2C shows a product, also manufactured by the pellicle mounting apparatus, in which only the pellicle frame 4 has been adhered to a surface of the reticle glass 1. The product shown in FIG. 2C is manufactured as follows: a dummy pellicle frame 5 on which the adhesive layer 20 is not formed is mounted on the pressure member 38, so that the dummy pellicle frame 5 serves as a pressure member for the reticle glass 1. Then, the same manufacturing operation as in FIGS. 2A and 2B is performed.

Figure 3B:
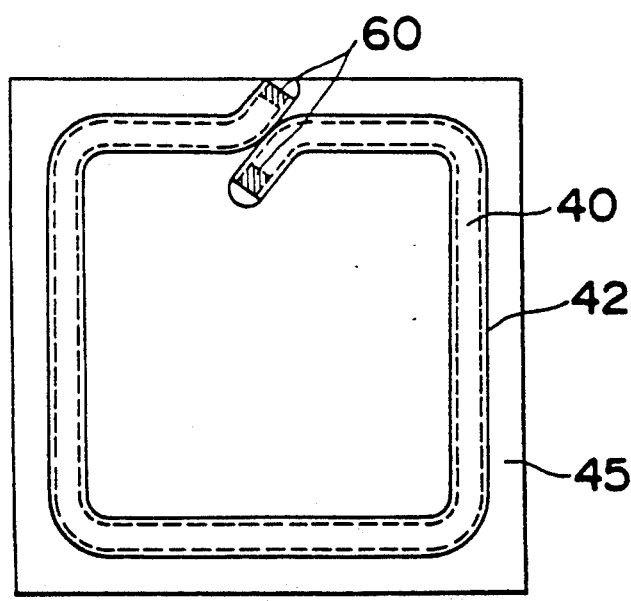
FIG. 3B is a view showing the construction of a holding plate and a tube filled with fluid of a pellicle mounting apparatus according to a second embodiment of the present invention.

A pellicle mounting apparatus according to a second embodiment of the present invention will be described below with reference to FIG. 3B. Two plugs 60 are formed at both ends of the tube 42 filled with fluid, provided approximately entirely along the periphery of each pellicle frame, as shown in FIG. 3B. The tube 42 of this configuration has the effect of uniformly applying pressure to the pellicle frames 4 and 5 through the elastic members 37 and 38, similarly to the tube 42 filled with fluid of the configuration as shown in FIG. 3A.

Pellicle mounting apparatus, according to a third embodiment through a sixth embodiment of the present invention, which do not comprise a tube in the supporting unit for supporting the pellicle frame will be described below.

Figure 4:
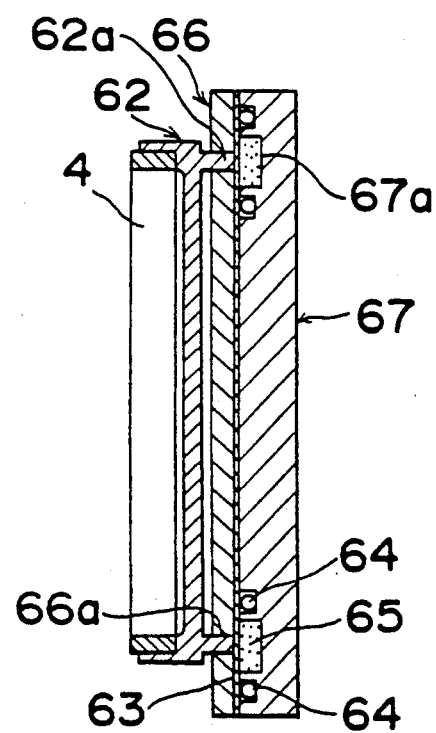
FIG. 4 is a partial sectional view showing a pellicle mounting apparatus according to a third embodiment of the present invention.

The pellicle mounting apparatus according to the third embodiment of the present invention will be described below with reference to FIG. 4. The supporting unit of the pellicle mounting apparatus of the third embodiment comprises holding plates 66 and 67 corresponding to the holding plates 44 and 45, and 46 and 47, as shown in FIG. 1. An elastic sheet or sealing member 63 made of a thin metal pate and interposed between holding plates 66 and 67. An elastic pressure member 62 having a rectangular frame-shaped projection 62a, is formed in correspondence with the periphery of the pellicle frame 4 and slidably penetrates through a rectangular frame-shaped hole 66a of the holding plate 66 to contact the elastic sheet 63. A fluid 65, such as grease or oil, is accommodated in a rectangular frame-shaped recess 67a of the holding plate 67 and opposes to the projection 62a through the elastic sheet 63. Sealing members 64 prevent the fluid 65 from leaking out from the recess 67a. The rectangular frame-shaped projection 62a has a sufficiently small reaction to deformation under pressure applied to the pellicle frame 4 as compared with the pressure. The pellicle frames 4 and 5 are pressed against the reticle glass 1 with the pressure of the fluid 65 uniformly applied to the pellicle frames 4 and 5 along the periphery thereof through the elastic pressure 62 and the elastic sheet 63. Thus, the pellicle frames 4 and 5 are uniformly adhered to the reticle glass 1 With the adhesive layers 20.

Figure 5:
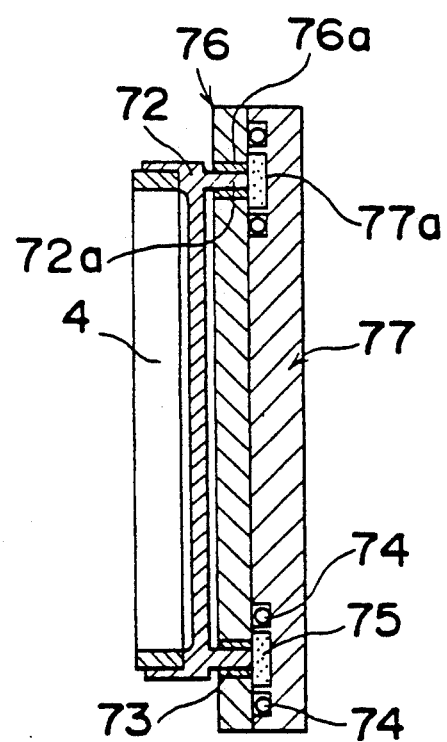
FIG. 5 is a partial sectional view showing a pellicle mounting apparatus according to a fourth embodiment of the present invention.

The pellicle mounting apparatus according to the fourth embodiment of the present invention will be described below with reference to FIG. 5. Referring to FIG. 5, the supporting unit of the pellicle mounting apparatus of the fourth embodiment comprises holding plates 76 and 77 corresponding to the holding plates 44 and 45 and 46 and 47, as shown in FIG. 1. A fluid 75, such as grease or oil, is accommodated in a rectangular frame-shaped recess 77a of the holding plate 77. An elastic pressure member 72 has a rectangular frame-shaped projection 72a formed in correspondence with the periphery of the pellicle frame 4 and slidably penetrating through a rectangular frame-shaped hole 76a of the holding plate 76 to contact the fluid 75 in the recess 77a. An elastic sealing member 73 is made of an adhesive agent, such as rubber adhesive, adhered to the entire periphery of the projection 72a and hole 76a and sealing members 74 for preventing fluid 75 from leaking out from the recess 77a. The rectangular frame-shaped projection 72a has a sufficiently small reaction to deformation under the pressure applied to the pellicle frame 4 as compared with the pressure. The pellicle frames 4 and 5 are pressed against the reticle glass 1 with the pressure of the fluid 75 uniformly applied to the entire pellicle frames 4 and 5 along the periphery thereof via the elastic pressure member 72. Thus, the pellicle frames 4 and 5 are uniformly adhered to the reticle glass 1 with the adhesive layers 20.

Figure 6:
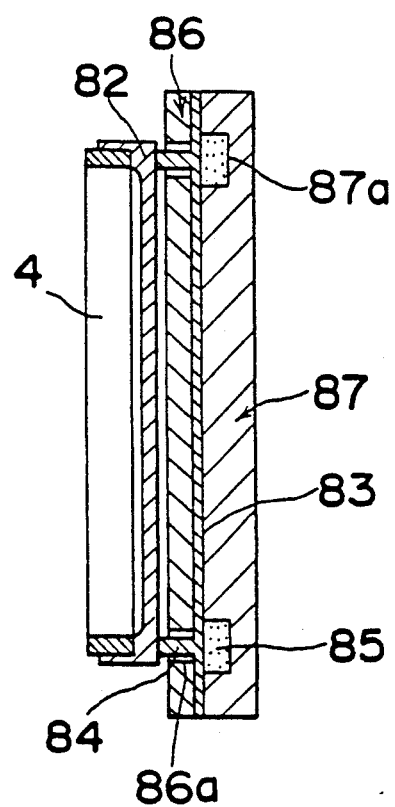
FIG. 6 is a partial sectional view showing a pellicle mounting apparatus according to a fifth embodiment of the present invention.

The pellicle mounting apparatus according to the fifth embodiment of the present invention will be described below with reference to FIG. 6. The supporting unit of the pellicle mounting apparatus of the fifth embodiment comprises holding plates 86 and 87 corresponding to the holding plates 44 and 45 and 46 and 47 as shown in FIG. 1 and an elastic pressure member 82. An elastic sheet 83 made of a material such as rubber is interposed between holding plates 86 and 87, and comprises a rectangular frame-shaped projection 84 formed in correspondence with the periphery of the pellicle frame 4 and slidably penetrates through a rectangular frame-shaped hole 86a of the holding plate 86 to contact the pressure member 82. And fluid 85 is accommodated in a rectangular frame-shaped recess 87a of the holding plate 86, formed at a portion corresponding to the projection 84. The rectangular frame-shaped projection 84 has a sufficiently small reaction to deformation under the pressure applied to the pellicle frame 4 as compared with the pressure. The pellicle frames 4 and 5 are pressed against the reticle glass 1 with the pressure of the fluid 85 uniformly applied to the pellicle frames 4 and 5 along the periphery thereof via the elastic pressure member 82 and the elastic sheet 83. Thus, the pellicle frames 4 and 5 are uniformly adhered to the reticle glass 1 with the adhesive layers 20.

The pellicle mounting apparatus according to the sixth embodiment of the present invention will be described below with reference to FIGS. 7A and 7B. The supporting unit of the pellicle mounting apparatus of the sixth embodiment comprises holding plates 96 and 97 corresponding to the holding plates 44 and 45, and 46 and 47, as shown in FIG. 1 and an elastic pressure member 92. A plurality of pistons 93 are arranged in a rectangular frame shape in correspondence with the periphery of the pellicle frame 4, and slidably penetrate through holes 96a on the holding plate 96. A fluid 95, such as grease or oil, is accommodated in a rectangular frame-shaped recess 97a of the holding plate 96. Sealing members 94 prevent the fluid 95 from leaking out from the recess 97a. Each piston 93 has a sufficiently small reaction to deformation under the pressure applied to the pellicle frame 4 as compared with the pressure. The pellicle frames 4 and 5 are pressed against the reticle glass 1 with the pressure of the fluid 95 uniformly applied to the pellicle frames 4 and 5 along the periphery thereof via the elastic pressure member 92 and the cylinders/pistons 93. Thus, the pellicle frames 4 and 5 are uniformly adhered to the reticle glass 1 with the adhesive layers 20.

Figure 9:
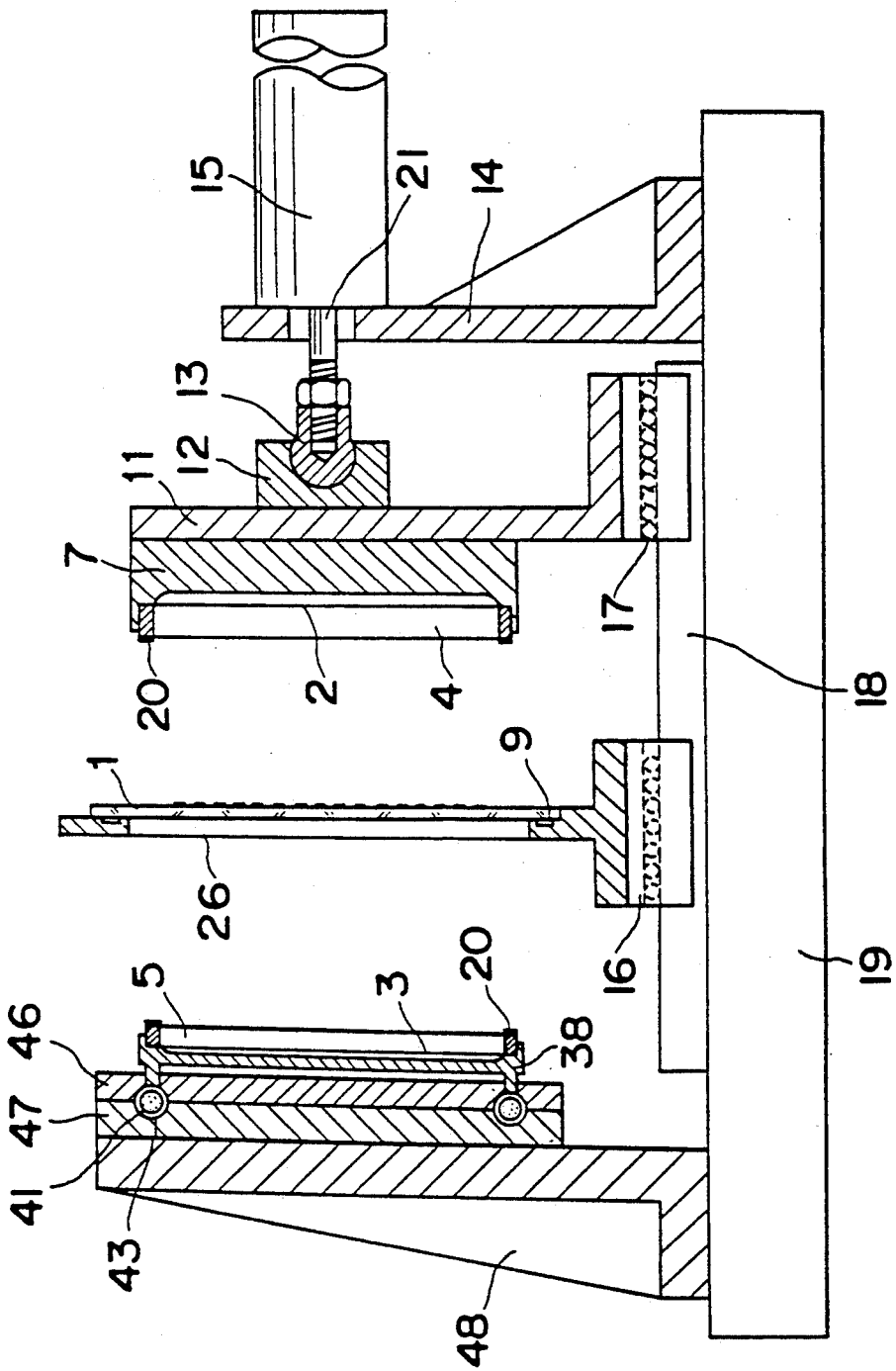
FIG. 9 is a sectional view showing a pellicle mounting apparatus according to a still another embodiment of the present invention.
Figure 10:
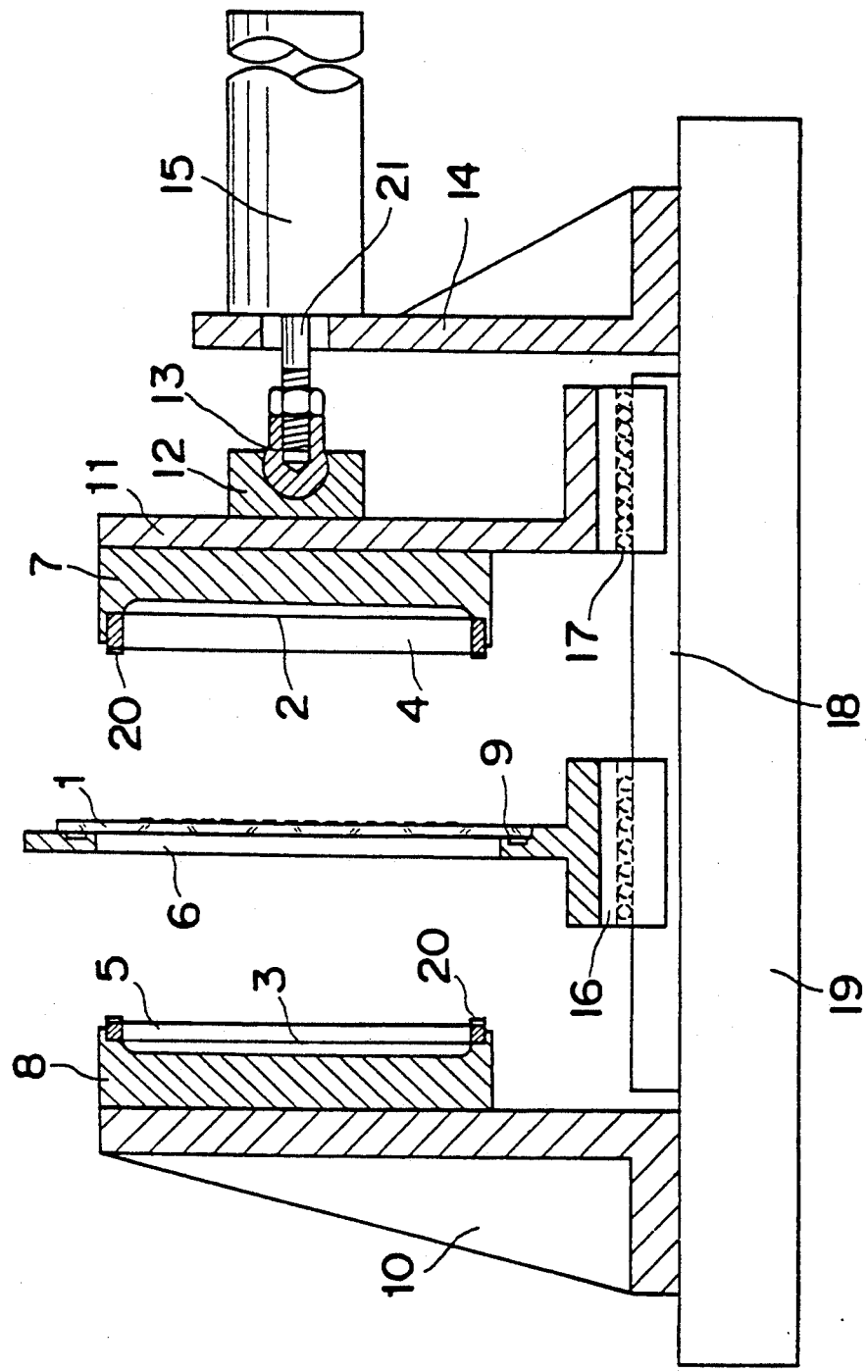
FIG. 10 is a sectional view showing a conventional pellicle mounting apparatus.

FIGS. 8 and 9 show a pellicle mounting apparatus according to other embodiments of the present invention. The pressurizing mechanism of the pellicle mounting apparatus according to these embodiments includes the pressure members of the conventional apparatus shown in FIG. 10. That is, one of a pair of pressure members of the embodiments is constructed similarly to the pressure member 7 or 8 of the conventional pellicle mount apparatus shown in FIG. 10 and the other pressure member is constructed similarly to the pressure member 37 or 38 of the first embodiment. The pellicle mounting apparatus according to these embodiments provides the effect of uniformly applying pressure to the pellicle frames 4 and 5 similarly to the pellicle mounting apparatus according to the first to sixth embodiments of the present invention.

Further, the pressurizing mechanism of the pellicle mounting apparatus may be modified to apply fluid pressure to the elastic pressure member in a desired distribution.

The pressurizing mechanism of the pellicle mounting apparatus may be modified to apply pneumatic pressure instead of fluid pressure to the elastic pressure member in a desired distribution.

As is apparent from the foregoing description, the pellicle mount apparatus according to the present invention comprises the elastic pressure member, which has a sufficiently small reaction to deformation under the pressure applied to the pellicle frame as compared with the pressure, and the pressurizing mechanism which applies fluid pressure uniformly to the periphery of the pellicle frame via the elastic pressure member. Thus, it is possible to absorb error produced during the manufacture of the parts such as the brackets or the pressure members, the error of the irregular flatness of the pellicle frames and that of the reticle glass, and the error of the irregular thickness of the adhesive layer. Consequently, the pellicle frame or frames can be adhered uniformly to the entire reticle glass.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A pellicle mount apparatus for adhering a pellicle frame to a surface of a reticle glass under pressure, said pellicle mount apparatus comprising:

a reticle glass support for supporting a reticle glass;

a pellicle frame support for supporting a pellicle frame;

an elastic pressure member provided on said pellicle frame support for contacting a pellicle frame along the periphery of the pellicle frame; and a pressurizing means for uniformly applying fluid pressure to the periphery of the pellicle frame through said elastic pressure member wherein said pressurizing means comprises:

a fluid pressure transfer portion disposed on said pellicle frame support adjacent to and along the periphery of said elastic pressure member, said fluid pressure transfer portion comprising an incompressible fluid; and a pressurizing device for applying pressure to said elastic pressure member through said fluid pressure transfer portion.

2. The pellicle mount apparatus of claim 1, wherein:

said elastic pressure member has a projection disposed along the periphery thereof; and said fluid pressure transfer portion comprises an endless tube having said incompressible fluid therein and being in contact with said projection of said elastic pressure member.

3. The pellicle mount apparatus of claim 1, wherein:

said elastic pressure member has a projection disposed along the periphery thereof; and said fluid pressure transfer portion comprises a tube having ends with plugs in said ends, having said incompressible fluid therein and being in contact with said projection of said elastic pressure member.

4. The pellicle mount apparatus of claim 1, wherein said fluid pressure transfer portion comprises a recess in said pellicle frame support having said incompressible fluid therein and a seal comprising a sealing member for preventing said incompressible fluid from leaking from said recess;

said pellicle frame support has a hole extending to said sealing member; and said elastic pressure member has a projection along the periphery thereof slidably inserted into said hole such that pressure from said incompressible fluid can be applied thereto through said sealing member.

5. The pellicle mount apparatus of claim 1, wherein:

said pellicle frame support has a hole extending therein;

said elastic pressure member has a projection along the periphery thereof slidably inserted into said hole of said pellicle frame support; and said fluid pressure transfer portion comprises a recess in said pellicle frame support opposite said projection of said elastic pressure member, said recess having said incompressible fluid therein, and said recess being sealed by an elastic sealing member in said hole and surrounding said projection.

6. The pellicle mount apparatus of claim 1, wherein said fluid pressure transfer portion comprises;

a recess in said pellicle frame support having said incompressible fluid therein; and an elastic sealing sheet having a projection thereon disposed opposite to said recess and contacting said elastic pressure member, said elastic sealing sheet sealing said incompressible fluid in said recess.

7. The pellicle mount apparatus of said claim 1, wherein said fluid pressure transfer portion comprises:

a recess in said pellicle frame support having said incompressible fluid therein; and a plurality of pistons disposed in respective through holes of said pellicle frame support, said pistons communicating with said recess and contacting said elastic pressure member; and a seal for sealing said incompressible fluid in said recess.

8. A pellicle mount apparatus for adhering a pellicle frame to a surface of a reticle glass under pressure, said pellicle mount apparatus comprising:

a reticle glass support for supporting a reticle glass;

a first pellicle frame support for supporting a second pellicle frame;

a second pellicle frame support for supporting a second pellicle frame;

an elastic pressure member provided on one of said pellicle frame supports for contacting a pellicle frame along the periphery of the pellicle frame; and a pressurizing means for uniformly applying fluid pressure to the periphery of the pellicle frame through said elastic pressure member wherein said pressurizing means comprises:

a fluid pressure transfer portion disposed on said pellicle frame support adjacent to and along the periphery of said elastic pressure member, said fluid pressure transfer portion comprising an incompressible fluid; and a pressurizing device for applying pressure to said elastic pressure member through said fluid transfer portion.

9. The pellicle mount apparatus of claim 8 wherein said first and second pellicle frames are each provided with a said elastic pressure member and a said fluid pressure transfer portion, whereby the first and second pellicle frames can both be applied to the reticle glass by pressure uniformly applied thereto through said elastic pressure members and said fluid pressure transfer portions by said pressurizing device applying pressure to one of the first and second frame supports.

10. The pellicle mount apparatus of claim 9, wherein one of said first and second pellicle frame supports and said reticle glass support are movably mounted with respect to the other of said first and second pellicle frame supports, said pressurizing device applying pressure to said pellicle frame supports by moving the one of said first and second pellicle frame supports and said reticle glass support toward the other of said first and second pellicle frame supports.

11. A pellicle mount apparatus, comprising:

a reticle glass support;

a pellicle frame support adjacent to said reticle glass support;

a pressure member mounted on said pellicle frame support for holding a pellicle frame along the periphery of the pellicle frame;

a fluid pressure transfer portion in said pellicle frame support along the periphery of and contacting said pressure member, said fluid pressure transfer portion comprising an incompressible fluid; and a pressure device for applying pressure to said pressure member through said fluid pressure transfer portion.

12. The pellicle mount apparatus of claim 11, wherein said fluid pressure transfer portion comprises a tube disposed in said pellicle frame support having said fluid therein and a hole extending in said pellicle frame support, and said pressure member has a projection extending into said hole and contacting said tube.

13. The pellicle mount apparatus of claim 11, wherein said fluid pressure transfer portion comprises a recess in said pellicle frame support having said fluid therein, an elastic sheet covering said recess and a hole extending in said pellicle frame support to said elastic sheet, and said pressure member has a projection extending into said hole and contacting said elastic sheet.

14. The pellicle mount apparatus of claim 11, wherein said fluid pressure transfer portion comprises a recess in said pellicle frame support having said fluid therein, a hole extending in said pellicle frame support to said recess, and an elastic sealing member in said hole, and said pressure member has a projection extending into said hole to said recess and contacting said fluid.

15. The pellicle mount apparatus of claim 11, wherein said fluid pressure transfer portion comprises a recess in said pellicle frame support having said fluid therein and an elastic sheet covering said recess, said elastic sheet having a projection contacting said pressure member.

16. The pellicle mount apparatus of claim 11, wherein said fluid pressure transfer portion comprises a recess in said pellicle frame support having said fluid therein, and a plurality of pistons extending through said pellicle frame support from said recess into contact with said pressure member.

17. The pellicle mount apparatus of claim 11, and further comprising a second pellicle frame support, one of said pellicle frame supports and said reticle glass support being movably mounted relative to the other said pellicle frame support.

18. The pellicle mount apparatus of claim 17, wherein both said pellicle frame supports are provided with a said pressure member and a said fluid pressure transfer portion.

* * * * *